(12) United States Patent
Cheng et al.

(10) Patent No.: US 10,586,799 B2
(45) Date of Patent: Mar. 10, 2020

(54) MULTIPLE-BIT ELECTRICAL FUSES (71) Applicant: International Business Machines Corporation, Armonk, NY (US)

(72) Inventors: Kangguo Cheng, Schenectady, NY (US); Ramachandra Divakaruni, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/012,951

(22) Filed: Jun. 20, 2018

(65) Prior Publication Data

US 2018/0323203 A1 Nov. 8, 2018

Related U.S. Application Data

(62) Division of application No. 15/585,826, filed on May 3, 2017, now Pat. No. 10,141,320.

(51) Int. Cl.
*H01L 27/112* (2006.01)
*H01L 23/525* (2006.01)
*H01L 23/00* (2006.01)

(52) U.S. Cl.
CPC .... *H01L 27/11206* (2013.01); *H01L 23/5256* (2013.01); *H01L 23/573* (2013.01)

(58) Field of Classification Search
None
See application file for complete search history.

(56) References Cited

U.S. PATENT DOCUMENTS

| | | | |
|---|---|---|---|
| 6,903,992 B1 | 6/2005 | Yoon | |
| 7,221,032 B2 | 5/2007 | Kondo | |
| 7,964,893 B2 | 6/2011 | Lee | |
| 8,004,059 B2* | 8/2011 | Kim | H01L 23/5256 257/529 |
| 8,299,570 B2 | 10/2012 | Kim et al. | |
| 8,362,572 B2 | 1/2013 | Huang et al. | |
| 8,574,975 B2 | 11/2013 | Kim | |
| 8,963,284 B2 | 2/2015 | Kim | |
| 9,058,887 B2* | 6/2015 | Hsu | G11C 17/18 |
| 9,240,375 B2 | 1/2016 | Zhang et al. | |
| 9,305,879 B2 | 4/2016 | Filippi et al. | |
| 2015/0069521 A1* | 3/2015 | Cheng | H01L 29/78696 257/379 |

FOREIGN PATENT DOCUMENTS

CN 103915411 A 7/2014

OTHER PUBLICATIONS

IBM "List of IBM Patents or Patent Applications Treated As Related; (Appendix P)", Filed Jun. 20, 2018, 2 pages.
Kangguo Cheng, et al., "Multiple-Bit Electrical Fuse ," U.S. Appl. No. 15/585,826, filed May 3, 2017.

* cited by examiner

*Primary Examiner* — Alexander G Ghyka (74) *Attorney, Agent, or Firm* — Cantor Colburn LLP; Vazken Alexanian (57) ABSTRACT

A method for forming a semiconductor device includes forming a nanosheet stack comprising alternating layers of a first material and a second material on a substrate. The method further includes removing portions of the stack to form tapered stack sidewalls, which have a taper angle in relation to a horizontal surface of the substrate. The method further includes converting the second material to a resistive material. The layers that include the resistive material form one or more electrical fuses.

20 Claims, 9 Drawing Sheets

| PROGRAM VOLTAGE, WHERE V1<V2<V3 | FUSE BREAK | RESISTANCE AFTER PROGRAM | BITS |
|---|---|---|---|
| 0 | NONE | R1 // R2 // R3 | 00 |
| V1 | 1 ONLY | R2 // R3 | 01 |
| V2 | 1 & 2 | R3 | 10 |
| V3 | ALL 3 | ∞ | 11 |

MULTIPLE-BIT ELECTRICAL FUSES

DOMESTIC PRIORITY

This application is a divisional of U.S. patent application Ser. No. 15/585,826, filed May 3, 2017, the disclosure of which is incorporated by reference herein in its entirety.

BACKGROUND

The present invention generally relates to semiconductor fabrication methods and devices. More specifically, the present invention relates to forming multiple-bit electrical fuses (e-fuses) that can store multiple bits of data.

E-fuses are used in semiconductor-based integrated circuits (IC) for a variety of functions, including acting as a single-bit memory device that is permanent and cannot be erased. In many applications, groups of e-fuses are used to store unique ID numbers for each individual IC. A typical e-fuse has wide cathode and anode terminals while having a narrow "fusable" material between the two terminals. Each e-fuse can store one bit of data, being either a "0" or "1" depending on the programming.

SUMMARY

Embodiments of the present invention are directed to a method for forming a semiconductor device. A non-limiting example of the method includes forming a nanosheet stack comprising alternating layers of a first material and a second material on a substrate. The method further includes removing portions of the stack to form tapered stack sidewalls, which have a taper angle in relation to a horizontal surface of the substrate. The method further includes converting the second material to a resistive material. The layers that include the resistive material form one or more electrical fuses.

Embodiments are also directed to a semiconductor device. A non-limiting example of the semiconductor device includes a semiconductor device comprising a nanosheet stack including tapered sidewalls formed on a substrate. The nanosheet structure further includes a first electrical fuse vertically stacked on a second electrical fuse. A length of the first electrical fuse is less than a length of the second electrical fuse to define a multiple-bit fuse. A common anode and cathode are shared by the first and second electrical fuses. A dielectric material isolates the first and second electrical fuses, and a pair of conductor contacts is electrically connected to the anode and cathode.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication can be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The phrase "e-fuse" and variations thereof are used in this detailed description to include semiconductor devices that are operable as electrical fuses. These electrical fuses operate according to principles of electromigration and are capable of storing bits of data (e.g., "0" or "1") based on the programmed state of the fuse.

Turning now to an overview of technologies that are more specifically relevant to aspects of the invention, electrically operable fuses, hereinafter referred to as "e-fuses" are utilized for a wide variety of purposes. There are challenges, however, in scaling e-fuses beyond the 10 nm node. As semiconductor device critical dimensions continuously scale downward, and as the number of functions for a given semiconductor device increases, the number of e-fuses required for performing all of the functions also increases. Conventional planar e-fuses require a relatively large on-die footprint. While fuse array structures have been introduced to manage a large number of planar e-fuses more efficiently, chip fabricators still face challenges when attempting to optimize the chip area and power load consumed by the e-fuses of a particular IC design. In addition, conventional e-fuses are limited to a single fuse and are capable of storing only a single data bit (i.e., either a "0" or a "1"). Therefore, chip surface is rapidly consumed as the amount of overall data to be stored by the e-fuses increases.

Turning now to an overview of aspects of the present invention, one or more embodiments of the invention address the above-described shortcomings of the prior art by forming one or more e-fuses in a vertical stack orientation to form a multiple-bit fuse device. Providing multiple stacked e-fuses on a chip surface enables the stacked e-fuses to operate as a permanent nonplanar memory in an IC. The stacked e-fuses can be covered with a conductive contact layer or other opaque material, which makes the stacked e-fuses resistant to reverse engineering. In embodiments of the present invention, the e-fuse vertical stack is formed from nanosheets or nanowire layers having tapered stack sidewalls. Tapering the sidewalls allows for the stacked multiple-bit fuse device to include different fuse lengths having different breakdown voltages. In this manner a multiple-bit e-fuse occupies a smaller footprint than that required for storing the same number of bits individually in planar e-fuses. The stacked e-fuses are fabricated according to embodiments of the invention to operate based on the theory of electromigration, where current density plays a role in programming the e-fuses. Also, the physical parameters (e.g. length, width, height, type of material used) of the stacked e-fuses determines the total resistivity and a breakdown voltage for each e-fuse.

In one or more non-limiting embodiments, each individual e-fuse included in the stack has a different breakdown voltage due to difference in their lengths with respect to one another. Accordingly, different voltages can be applied to obtain different combinations of broken fuses. In this manner, the multiple-bit fuse device can be programmed to achieve different bits (e.g., 00, 01, 10, 11) based on the combination of broken fuses.

The above-described aspects of the invention address the shortcomings of the prior art by forming a stacked e-fuse capable of storing multiple bits, while providing a reduced footprint. In this manner, increased data storage can be achieved using a reduced surface area of the chip.

Figure 1:
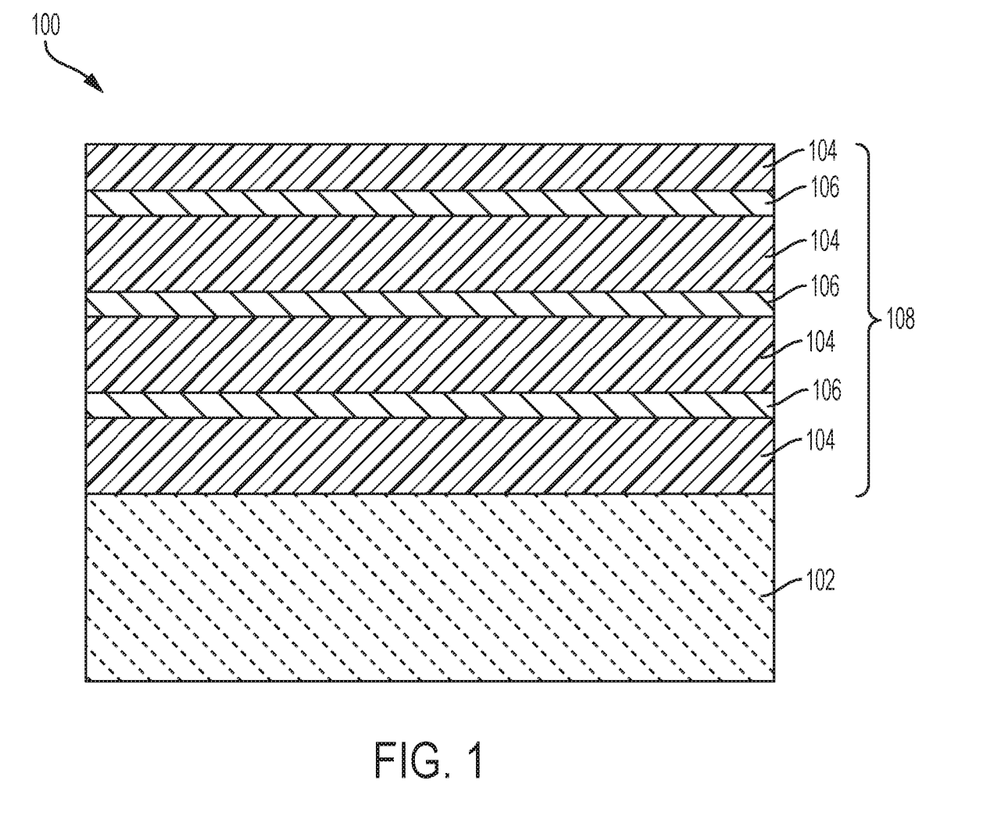
FIG. 1 depicts a cross-sectional view of a semiconductor structure using stacked nanosheets according to one or more embodiments of the present invention.

Turning now to a more detailed description of aspects of the present invention, stacked e-fuses formed according to embodiments of the present invention are described in detail herein by referring to the accompanying drawings in FIGS. 1-9. FIG. 1 depicts a cross-sectional view of a starting semiconductor structure 100 formed from stacked nanosheets or nanowires according to one or more embodiments of the present invention. The structure 100 will, after the fabrication operations described herein, become a stacked e-fuse structure fabricated according to embodiments of the present invention. The structure 100 includes a semiconductor substrate 102. Formed over the substrate 102 is a plurality of alternating layers of a first material 104 and alternating layers of a second material 106 that form a stack 108. The first material 104 and the second material 106 are composed of different types of semiconductor material. For example, the first material 104 can be formed of silicon germanium (SiGe), while the second material can be formed of silicon (Si). In another embodiment, the first material 104 can be formed of Si, while the second material 106 can be formed of SiGe.

The substrate 102 can include Si, germanium (Ge), SiGe, silicon carbide (SiC), and those materials consisting essentially of III-V compound semiconductors. Other suitable substrates include II-VI compound semiconductors. The substrate 102 can also include an organic semiconductor or a layered semiconductor such as, for example, Si/SiGe, a Si-on-insulator, or a SiGe-on-insulator. A portion or the entire substrate 102 can be amorphous, polycrystalline, or monocrystalline. The substrate 102 can be doped or undoped, or contain doped regions and undoped regions therein. The substrate 102 can further include other structures (not shown) such as isolation structures.

The first and second layers 104, 106 can be formed from nano-type semiconductor elements including, but not limited to, nanosheets and nanowires. In some embodiments, the first material 104 is sacrificial and will be removed during a later fabrication process as described herein. In one or more embodiments, the first and second layers 104, 106 are formed on the substrate 102 at the same time as field-effect transistors (FET) and other devices are formed on the substrate 102.

Figure 2:
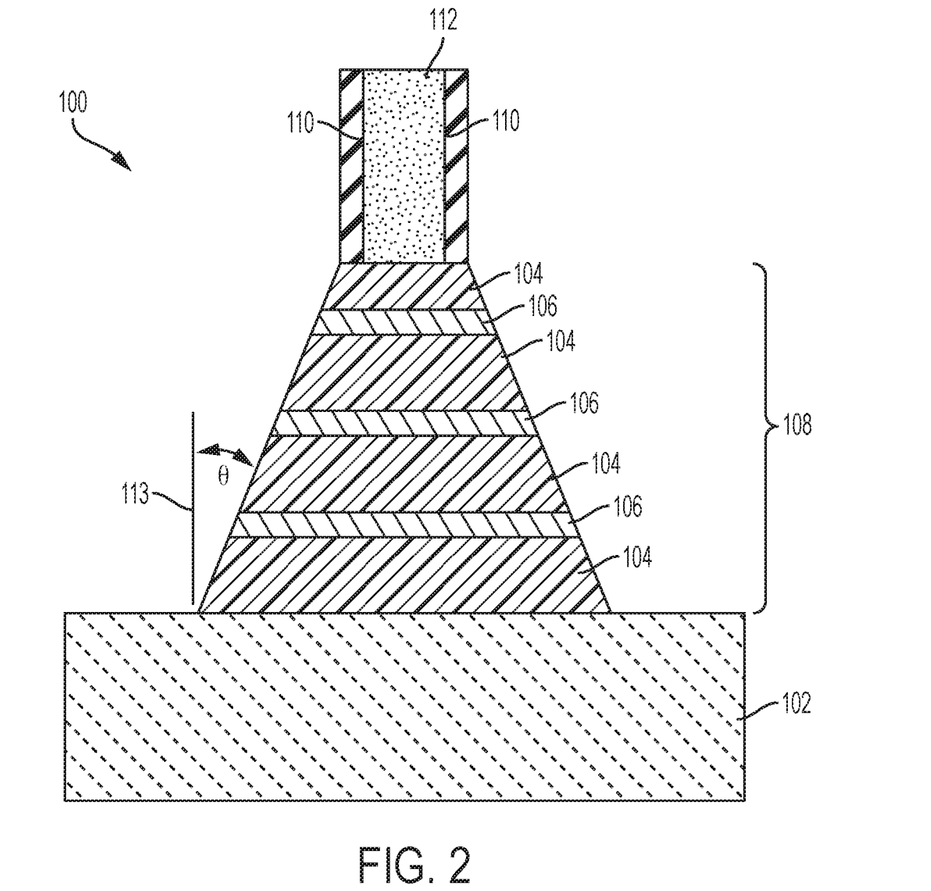
FIG. 2 depicts a cross-sectional view of the semiconductor structure after removing material to form a tapered nanosheet stack on the structure according to one or more embodiments of the present invention.

FIG. 2 depicts a cross-sectional view of the semiconductor structure 100 after removing material to form a tapered nanosheet stack on the structure according to one or more embodiments of the present invention. FIG. 2 is a continuation of the processes discussed in FIG. 1. A set of spacers 110 are added to a top surface of the stack 108. Once the spacers 110 are in position, a dummy gate 112 is added to the structure 100 by filling the region between the spacers 110 by deposition and patterning processes. The spacers 110 and dummy gate 112 act as a hard mask to protect portions of the stack 108 during later etching or removal processes. Once the spacers 110 and dummy gate 112 are in place, a removal process is conducted to take away portions of the stack 108 not covered by the spacers 110 and dummy gate 112. This removal process creates an angled sidewall (tapered sidewall) with a taper angle θ to be formed by the sidewalls of the stack 108 in relation to a vertical plane reference 113, or alternately, to a horizontal plane reference including the top surface of the substrate 102 which contacts the stack 108. In some embodiments, the removal process includes a tapered etch process. Two methods of etching to remove material from the structure 100 include gas phase hydrofluoric acid (HCl) and a wet etch process with an etchant containing ammonia and hydrogen peroxide. Alternatively, the etching process can include, but is not limited to, a directional anisotropic reactive-ion etching (RIE) process. Embodiments of the present invention are not limited as to the specific process applied for etching the structure, and other processes are possible. Other embodiments of the present invention can apply different etching processes and are not limited herein. The positioning and total width of the spacers 110 in relationship to a base width of the stack 108 (prior to the removal process) will determine the ultimate taper angle 113. The taper angle 113 of the stack 108 is essential to the formation of e-fuses having different programmable voltages as described herein, as each e-fuse formed in this manner will have a different fuse length.

Figure 3:
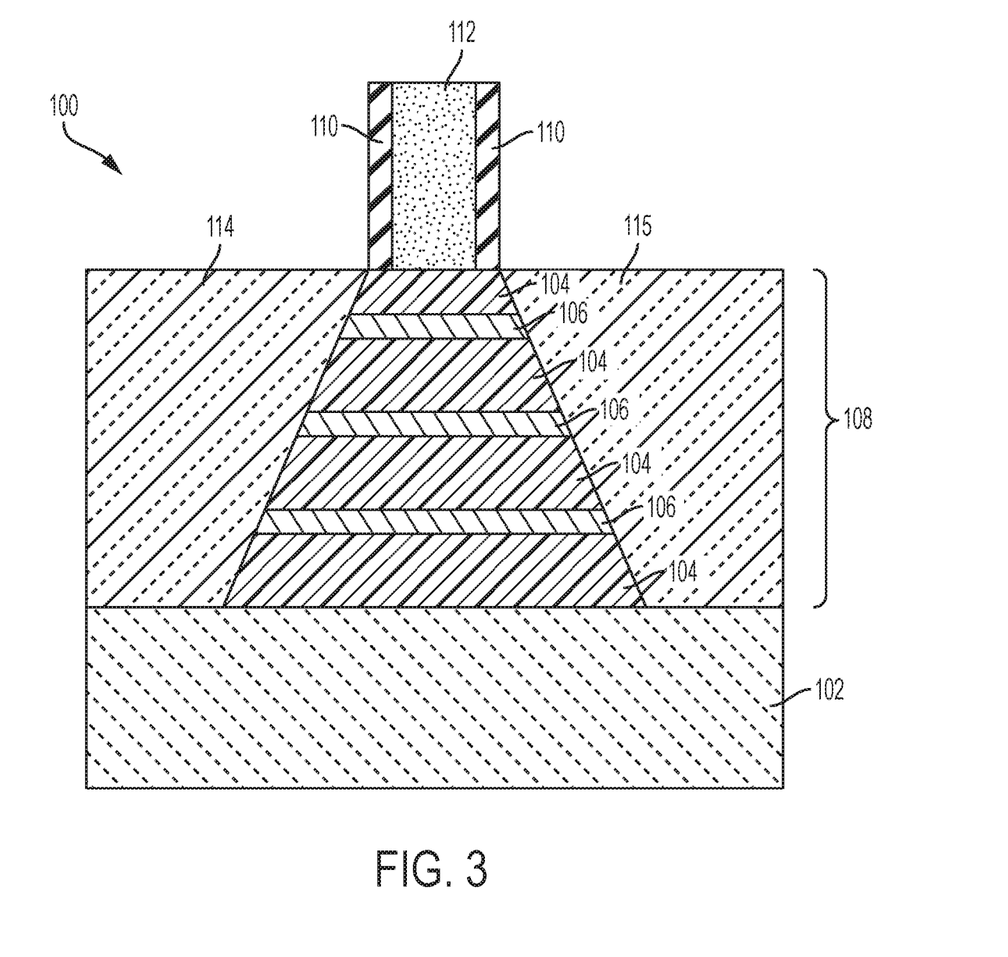
FIG. 3 depicts a cross-sectional view of the semiconductor structure after forming an anode base and cathode base according to one or more embodiments of the present invention.

FIG. 3 depicts a cross-sectional view of the semiconductor structure 100 after forming an anode base 114 and a cathode base 115 according to one or more embodiments of the present invention. FIG. 3 is a continuation of the processes discussed in FIG. 2. An epitaxy growth process is applied to the structure 100 to grown an anode base 114 and cathode base 115 from the upper surface of the substrate 102. The anode base 114 and cathode base 115 fill the region previously occupied by material of the stack 108 which was removed as described in FIG. 2. The epitaxy process used to form the anode base 114 and cathode base 115 can be carried out using, for example, vapor phase epitaxy (VPE), molecular beam epitaxy (MBE) or liquid phase epitaxy (LPE) with a gaseous or liquid precursor, such as, for example, silicon tetrachloride.

Dopants can be incorporated in the anode base 114 and cathode base 115 during epitaxy (in-situ) or after epitaxy (ex-situ). Doping techniques include ion implantation, gas phase doping, plasma doping, plasma immersion ion implantation, cluster doping, infusion doping, liquid phase doping, solid phase doping, or a combination of these techniques. Epitaxy materials can be Si, SiGe, or carbon-doped silicon (SiC). Dopants can be n-type or p-type. In some embodiments, the anode base 114 and cathode base 115 locations are reversed. As the e-fuses are not polarized devices, orientation of the anode base 114 and cathode base 115 is not limiting and can be reversed.

Figure 4:
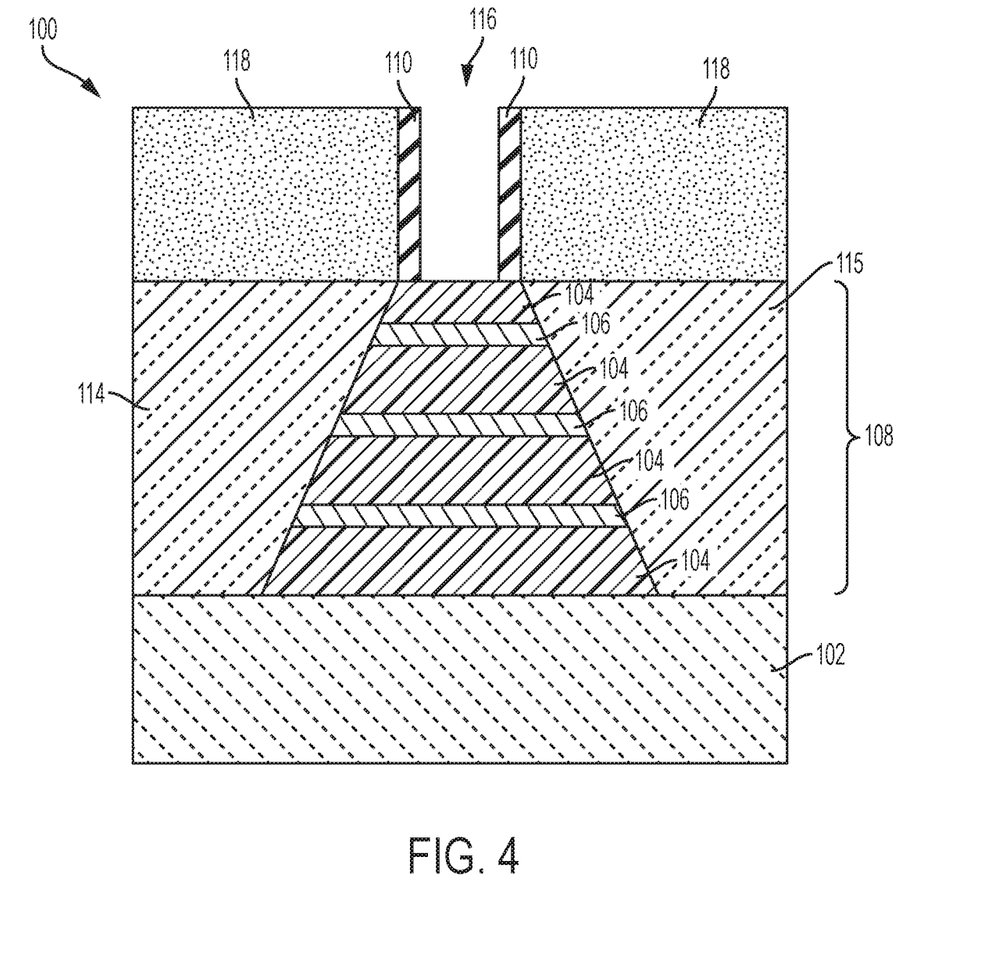
FIG. 4 depicts a cross-sectional view of the semiconductor structure after forming an inter-level dielectric layer according to one or more embodiments of the present invention.

FIG. 4 depicts a cross-sectional view of the semiconductor structure 100 after forming an inter-level dielectric layer 118 according to one or more embodiments of the present invention. FIG. 4 is a continuation of the processes discussed in FIG. 3. An inter-level dielectric (ILD) layer 118 is deposited onto the top surface of the anode base 114 and the cathode base 115. In at least one non-limiting embodiment, the ILD layer 118 can be blanket deposited so as to cover the upper surfaces of the spacers 110 and the dummy gate 112. A chemical-mechanical planarization (CMP) process can then be performed, which stops on the upper surface of the spacers 110 and the dummy gate 112.

Once the ILD 118 has been deposited, the dummy gate 112 is removed from the structure 100, creating a recess region 116 (recess) devoid of material. The recess region 116 exposes a layer of the first material 104 located between the spacers 110. In one or more embodiments, a selective RIE etching process is performed that is selective to the material of the dummy gate 112. In this manner, the dummy gate 112 is removed while maintaining to the spacers 110 and the ILD 118.

Figure 5:
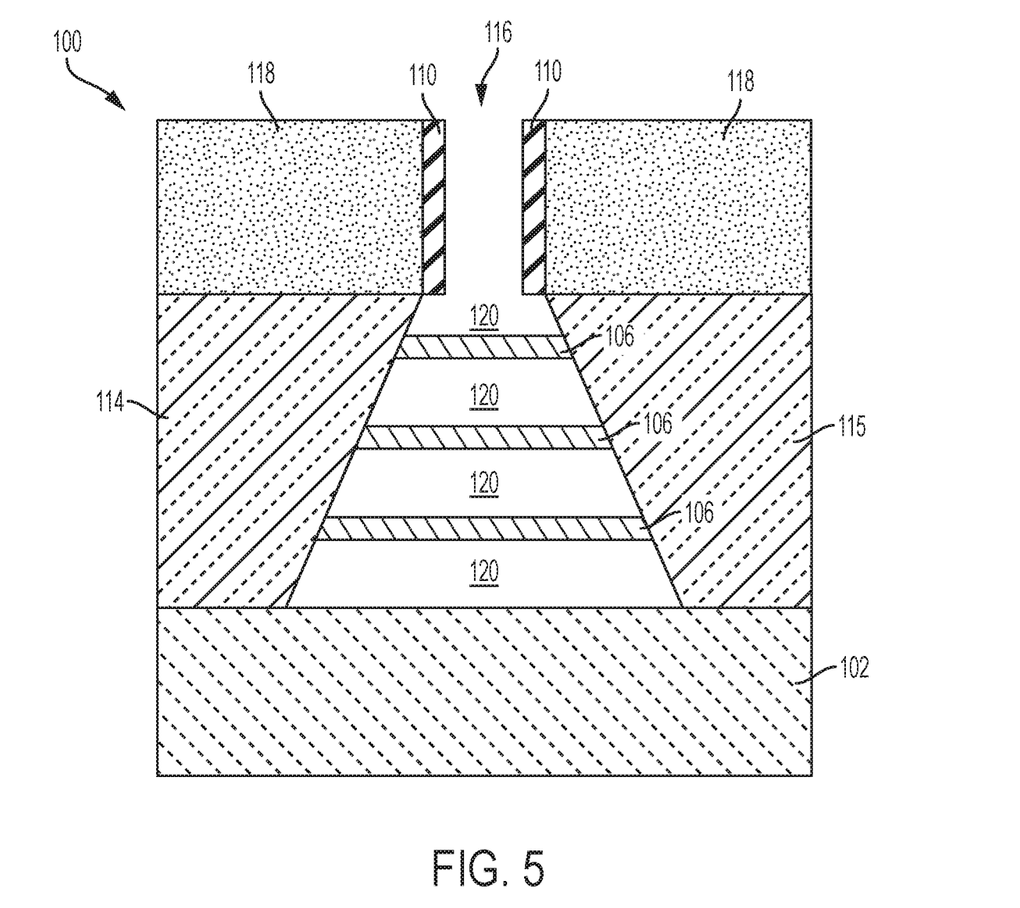
FIG. 5 depicts a cross-sectional view of the semiconductor structure after removing selected layers of the stack according to one or more embodiments of the present invention.

FIG. 5 depicts a cross-sectional view of the semiconductor structure 100 after removing selected layers of the stack 108 according to one or more non-limiting embodiments of the present invention. For example, the structure 100 is shown after removing portions of the first material 104 (of FIG. 4) while maintaining portions of the second material 106. The same or a different removal process as described in FIG. 2 can be performed to selectively remove the portions of the first material 104 with respect to the portions of the second material 106.

Removal of the portions of first material 104 results in the formation of a plurality of void regions (voids) 120 within the structure 100 thereby releasing layers of the second material 106. The released layers of the second material 106 can be referred to as suspended semiconductor nanosheets 106. When the second material 106 is formed as nanowires, than the removal of the first material forms suspended semiconductor nanowires. The voids 120 and recess 116 provide spaces for the deposition of additional material within the structure 100 as described in the following figures. When the first material 104 is SiGe and the second material 106 is Si, the layers of SiGe 104 can be selectively removed using a gas phase hydrochloride (HCl) etchant or a wet etchant containing hydroperoxide. In another embodiment where the first material 104 is Si and the second material 106 is SiGe, the Si layers 104 can be selectively etched away with respect to the SiGe layers 106 using, for example, a wet etch process containing ammonia ($NH_3$). When the material intended to remain (i.e., be released) is already formed as a metal material, the subsequent suspended semiconductor nanowires can be utilized as individual e-fuses without requiring additional material conversion processes such as, for example, the subsequent silicide conversion described below in regards to FIG. 6.

Figure 6:
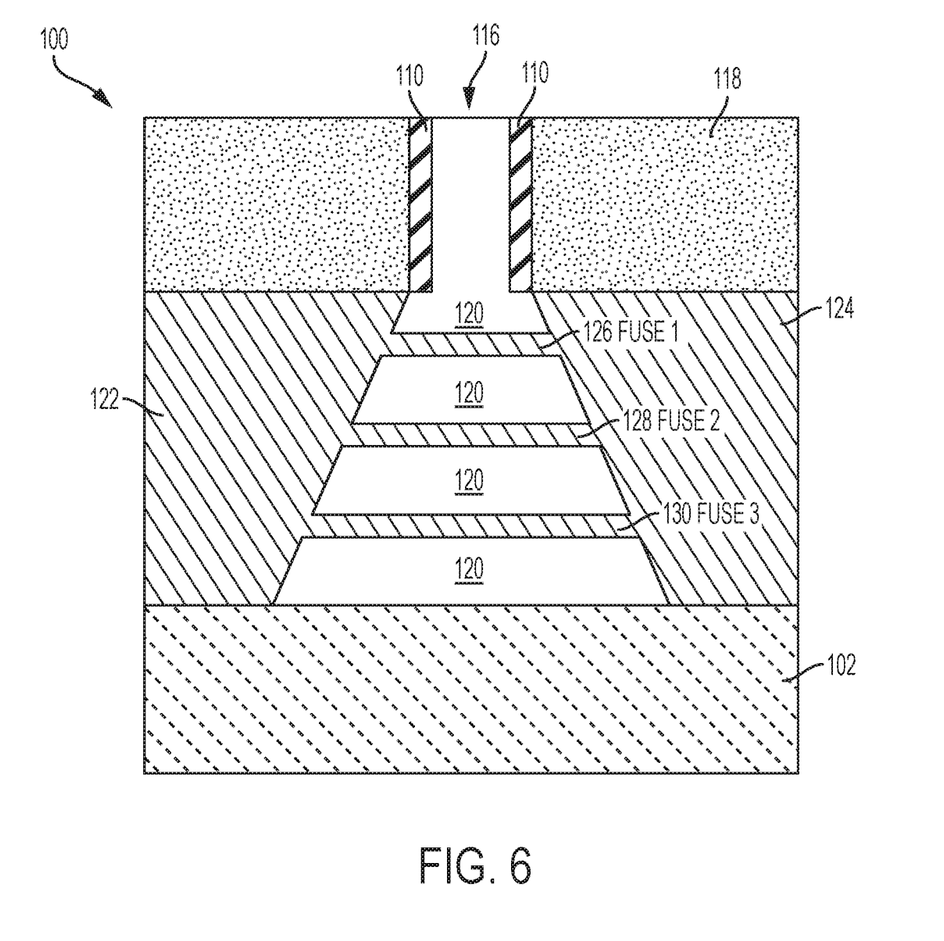
FIG. 6 depicts a cross-sectional view of the semiconductor structure after converting the second material to a silicide to form e-fuses according to one or more embodiments of the present invention.

FIG. 6 depicts a cross-sectional view of the semiconductor structure 100 after applying a silicide conversion process to the maintained layers of the second material 106 (e.g., the suspended nanosheets 106) according to one or more embodiments of the present invention. The second material 106 (e.g., the suspended nanosheets 106), the anode base 114, and the cathode base 115 are converted into a silicide material to form e-fuses 126, 128 and 130. The formation of silicide onto the structure 100 changes the second material 106 into a resistive material that is used as an e-fuse. As described above, some embodiments allow for the material intended to remain (i.e., be released) to be formed as a metal material, and therefore would not require conversion to a silicide material.

The conversion process includes depositing a layer of metal (e.g., nickel, cobalt, or titanium, etc.) on the surface of the structure 100 to cover the second material 106. The structure 100 is then heated such that the metal reacts with the Si to form silicide e-fuses 126, 128 and 130. In some embodiments, the silicide includes nickel. After a heating process is conducted to the structure 100, a nickel-silicide material is formed, for example. When the second material 106 is SiGe, the metal material (e.g., nickel, cobalt, etc.) deposited on the layers 106 reacts with the SiGe when heated, and converts the layers 106 into silicide germanide e-fuses 126, 128 and 130.

Any unreacted metal present can be removed after the formation of the silicide or silicide germanide material. For example, typically the nanosheet/nanowire stack 108 and the anode base and cathode base 114, 115 contain semiconductor materials (Si, SiGe, etc.). A layer of silicide is deposited onto the structure 100. The silicide material is directly applied to the anode base 114, cathode base 115, and the second material 106 (all of FIG. 5) to form a doped anode 122 (anode), a doped cathode 124 (cathode), and e-fuses.

Continuing with FIG. 6, three e-fuses 126, 128, 130 (labeled fuse 1, 2, and 3, respectfully) are shown. However, more or fewer e-fuses can be present in a device. Each e-fuse 126, 128, 130 can be used to store one bit of information. If the e-fuse is closed or "unbroken", the value of the e-fuse is 0. Likewise, if the e-fuse is open or "broken", the value of the e-fuse is 1. Therefore, the status of the e-fuse retains one bit of information. In at least one example, one or more of the e-fuses 126, 128, 130 can only be broken once and cannot be repaired or restored. In this manner, the e-fuses 126, 128, 130 can permanently retain memory of the value of one bit and cannot be written over or reset. In order to store the value of an individual e-fuse 126, 128, 130, the e-fuse must be "programmed" by either applying or not applying a breakdown voltage to the e-fuse in order to open or break the e-fuse. The breakdown voltage creates a current in the e-fuse sufficient to break the e-fuse. An example of a process for programming the e-fuse is described in the following figures.

Figure 7:
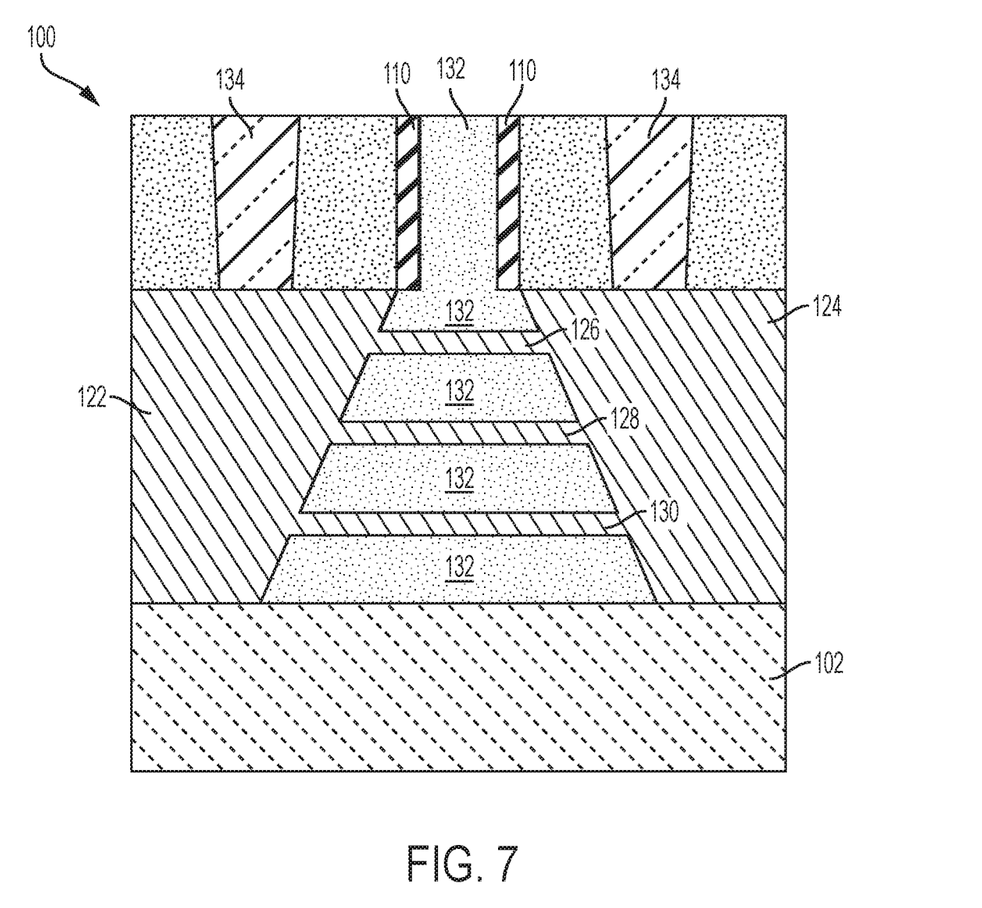
FIG. 7 depicts a cross-sectional view of the semiconductor structure after depositing a dielectric fill and forming conductor contacts according to one or more embodiments of the present invention.

FIG. 7 depicts a cross-sectional view of the semiconductor structure 100 after depositing a dielectric fill 132 and forming conductor contacts according to one or more embodiments of the present invention. FIG. 7 is a continuation of the processes discussed in FIG. 6. The dielectric layer 132 is deposited onto the structure 100, and fills the voids 120 and recess 116 (of FIG. 6). The process continues with the structure 100 being partially covered by a mask (not shown). In one or more embodiments, an etching process is conducted to remove portions of the ILD 118 from the structure 100. The purpose of the mask and the etching process is to define regions where a plurality of conductor contacts 134 will be deposited. The conductor contacts 134 is then deposited into the regions removed by the etching process, forming conductor contacts 134 electrically connected to the anode 122 and cathode 124. In some embodiments, an optional planarization process can be performed to reduce the height of the structure 100 due to material overflow during the fabrication of the conductor contacts 134. Conductor contact materials include but are not limited to a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

Figure 8A:
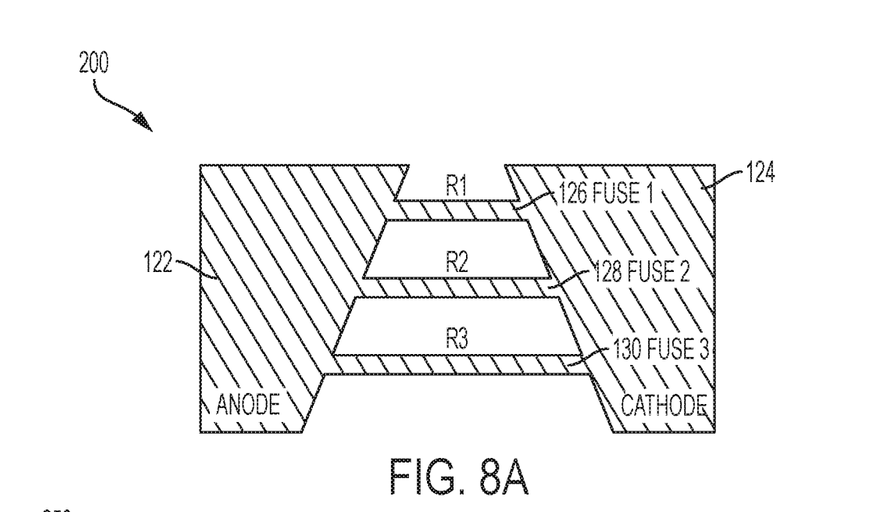
FIG. 8A depicts a cross-sectional view of a completed e-fuse structure according to one or more embodiments of the present invention.

FIG. 8A depicts a cross-sectional view of a completed e-fuse structure 200 according to one or more embodiments of the present invention. The structure 200 includes the anode 122, the cathode 124, the first e-fuse 126, the second e-fuse 128, and the third e-fuse 130 (labeled fuse 1, 2, and 3, respectfully). In other embodiments, four or more e-fuses can be formed within a structure 100, and is only limited by the number of layers in the stack 108 (of FIG. 2). Each e-fuse 126, 128, 130 is a different length and requires a different breakdown voltage to break or open the e-fuse. This feature is achieved based on the different quantities of resistive material used to form the e-fuses 126, 128, 130 due to the tapered sidewalls of the stack 108 as described in FIG. 2. In at least one example, the first e-fuse 126 is shorter than the second e-fuse 128 and the third e-fuse 130. In a similar manner, the second e-fuse 128 is shorter than the third e-fuse 130. Thus, it will take less breakdown voltage to open the first e-fuse 126 than it will take to open the second e-fuse 128 or the third e-fuse 130. In this manner, an operator can apply a predetermined breakdown voltage to open one, two, or more e-fuses 126, 128, 130 as required.

Figure 8B:
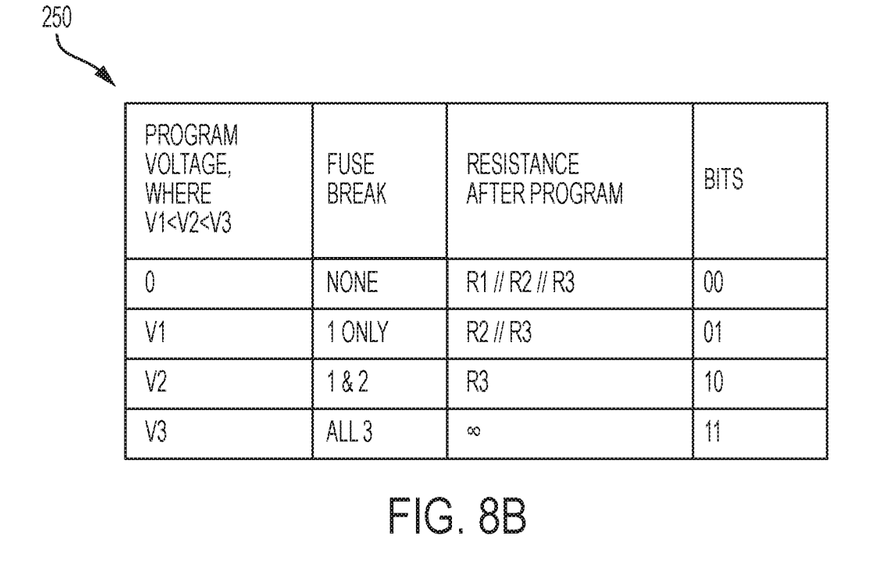
FIG. 8B depicts a chart showing details for programming the e-fuses depicted in FIG. 8A according to one or more embodiments of the present invention.

FIG. 8B depicts a chart 250 showing details for programming e-fuses as depicted in FIG. 8A according to one or more embodiments of the present invention. Chart 250 contains information relating to the structure 200 as described in FIG. 8A. Structure 200 includes 3 e-fuses 126, 128, 130 (i.e., e-fuses labeled 1, 2, and 3 respectfully). Each e-fuse 126, 128, 130 has an equivalent resistance associated with it, with the equivalent resistance of each e-fuse 126, 128, 130 being a function of length. Therefore, the shortest e-fuse (e.g., e-fuse 126) has the least amount of resistance and therefore will break open at the smallest breakdown voltage level as compared to longer-length e-fuses.

An operator reads the stored value of the e-fuses by measuring the resistance of the structure 200 after a breakdown voltage has been applied. The resistance measurement can be conducted by several methods, including but not limited to passing a known current through the structure 200, measuring the resultant voltage, and applying Ohm's Law to determine the resistance. By referencing chart 250 or similar, the operator can then determine the state of one or more of the e-fuses 126, 128, 130 and thus, their corresponding stored values. In chart 250, R1, R2, and R3 refers to the resistance of the e-fuses 126, 128, 130 respectively, while the symbol "II" corresponds to a mathematical function to determine the combined resistance for multiple resistors in parallel.

As an example, chart 250 shows that in order to store 2 bits as "00", all three e-fuses 126, 128, 130 should remain closed ("FUSE BREAK=NONE"), and no breakdown voltage is required. If the operator wishes to store the value "01", e-fuse 1 should be 'broken" or open while e-fuses 2 and 3 should remain closed. The e-fuses 126, 128, 130 are then programmed by passing a breakdown voltage V1 through the common anode 122 and cathode 124 of the structure 200 (of FIG. 8A). By selecting the appropriate voltage, e-fuse 1 will break open while e-fuses 2 and 3 remain unbroken or closed. In another example, in order to store the value "10", e-fuses 1 and 2 should be open while e-fuse 3 should be closed. Finally, to store a value of "11", all three e-fuses 126, 128, 130 should be open. Due to the design of the e-fuses, e-fuse 2 can only be open if e-fuse 1 is also open. Likewise, e-fuse 3 can only be open if e-fuse 1 and 2 are open. Therefore, three e-fuses 126, 128, 130 can provide storage of two bits of information containing four different bit values: "00", "01", "10", and "11". Other embodiments are possible using more than three e-fuses thereby storing a larger number of bits.

Figure 9:
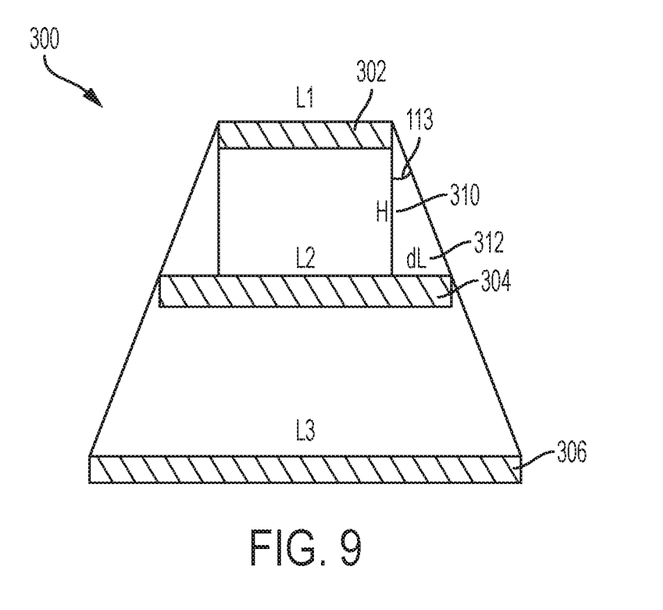
FIG. 9 depicts a cross-sectional view of a completed e-fuse structure showing details of the geometries of the e-fuses and the stack taper angles according to one or more embodiments of the present invention.

FIG. 9 depicts a cross-sectional view of the structure 300 showing geometric details between three e-fuses 302, 304, 306, for example, and stack taper angles according to one or more embodiments of the present invention. In this view, the relationship between e-fuse length and taper angle is explained. The structure 300 includes a first length (L1) of e-fuse 1 302 (of FIG. 8A), a second length L2 of e-fuse 2 304, a third length (L3) of e-fuse 3 306, a taper angle 113 (defined as the angle from the vertical plane, or alternately, from the horizontal plane to the slope of the sidewalls of the stack as described in FIG. 2), a height dimension 310 (H) between e-fuses 302-306 (corresponding to the distance between second material 106 layers as described in FIG. 2), and a difference in length "dL" 312 defined as the change in length from one e-fuse to the next e-fuse present in the structure 300. The length measurements are used to determine the total resistance of a given e-fuse 126, 128, 130, and thus the breakdown voltage necessary to break open a particular e-fuse 126, 128, 130. Furthermore, the taper angle 113 ensures that each e-fuse 126, 128, 130 is a different length, and thus a different resistance, and that e-fuses 126,

128, 130 increase in length and total resistance the further down a particular e-fuse 126, 128, 130 is located in a stack.

As described herein, one or embodiments of the invention provide an e-fuse having a vertically stacked orientation. The stacked e-fuse has a reduced footprint compared to convention e-fuses, but is capable of storing multiple bits instead of only a single bit. In this manner, several stacked e-fuses can be formed on a chip to achieve increased data storage while using less chip surface area.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a nanosheet stack on a semiconductor substrate, the nanosheet stack comprising tapered sidewalls formed on a substrate, the nanosheet structure further comprising a first electrical fuse vertically stacked on a second electrical fuse, wherein a length of the first electrical fuse is less than a length of the second electrical fuse to define a multiple-bit fuse;
   a common anode and cathode shared by the first and second electrical fuses;
   a dielectric material isolating the first and second electrical fuses; and
   a pair of conductor contacts electrically connected to the anode and cathode,
   wherein the tapered sidewalls have a taper angle in relation to a horizontal surface of the substrate, and wherein the taper angle extends inward from the semiconductor substrate toward an upper surface of the nanosheet stack.

2. The semiconductor device of claim 1, wherein the at least one electrical fuse includes a plurality of electrical fuses.

3. The semiconductor device of claim 2, wherein the plurality of electrical fuses defines two or more nanosheet layers comprising a second material.

4. The semiconductor device of claim 3, wherein each nanosheet layer forms a separate electrical fuse.

5. The semiconductor device of claim 4, wherein each electrical fuse is configured to operate as a memory storage device.

6. The semiconductor device of claim 5, wherein the tapered sidewalls form electrical fuses of predetermined variable lengths.

7. The semiconductor device of claim 6, wherein the variable lengths define variable resistances.

8. The semiconductor device of claim 1, wherein the taper angle sets a different breakdown voltage for each electrical fuse among the one or more electrical fuses, and wherein each electrical fuse is programmed by applying the breakdown voltage.

9. The semiconductor device of claim 6, wherein the plurality of electrical fuses define a combined resistive value based on the variable lengths of each electrical fuse being arranged in parallel to each other.

10. The semiconductor device of claim 6, wherein the variable lengths create different combined resistances.

11. The semiconductor device of claim 10, wherein the combined resistance increases from an upper surface of the nanosheet layers stack to the substrate.

12. The semiconductor device of claim 10, wherein a length of each electrical fuse defines a breakdown voltage.

13. The semiconductor device of claim 11, wherein each electrical fuses has a different breakdown voltage with respect to one another.

14. The semiconductor device of claim 10, wherein the breakdown voltages increase from an upper surface of the nanosheet layers stack to the substrate.

15. The semiconductor device of claim 1, wherein the at least one electric fuse is covered with an opaque material.

16. The semiconductor device of claim 15, wherein the opaque material inhibits reverse engineering of the at least one electric fuses resistant.

17. The semiconductor device of claim 1, wherein the electrical fuses are configured to store bits of information.

18. The semiconductor device of claim 17, wherein the bits of information are stored based on a state of each electrical fuse.

19. The semiconductor device of claim 18, wherein the state is one of a closed state or an open state.

20. The semiconductor device of claim 19, wherein each electrical fuse transitions from the closed state to the open state when an applied voltage exceeds the breakdown voltage.

* * * * *